United States Patent [19]
Hirabayashi

[11] Patent Number: 6,154,394
[45] Date of Patent: Nov. 28, 2000

[54] DATA INPUT-OUTPUT CIRCUIT AND SEMICONDUCTOR DATA STORAGE DEVICE PROVIDED THEREWITH

[75] Inventor: Osamu Hirabayashi, Kanagawa-ken, Japan

[73] Assignee: Kabushiki Kaisha Toshipa, Kanagawa-ken, Japan

[21] Appl. No.: 09/299,857

[22] Filed: Apr. 26, 1999

[30] Foreign Application Priority Data

Apr. 27, 1998 [JP] Japan ................................ 10-117168

[51] Int. Cl.$^7$ ................................................ G11C 16/04
[52] U.S. Cl. ..................... 365/189.05; 365/233; 365/207
[58] Field of Search ........................... 365/189.05, 233, 365/207, 189.01, 230.01

[56] References Cited

U.S. PATENT DOCUMENTS

| | | | |
|---|---|---|---|
| 5,043,944 | 8/1991 | Nakamura et al. | 365/189.05 |
| 5,488,581 | 1/1996 | Nagao et al. | 365/189.05 |
| 5,691,942 | 11/1997 | Inoue | 365/189.05 |
| 5,959,900 | 9/1999 | Matsubara | 365/189.05 |

*Primary Examiner*—David Nelms
*Assistant Examiner*—Hoai V. Ho
*Attorney, Agent, or Firm*—Banner & Witcoff, Ltd.

[57] ABSTRACT

The input-output terminal of a semiconductor memory is provided with a data input-output circuit for making it possible to improve the speed of the data input-output by synchronizing the data outputting operation and the Hi-Z control of an output buffer. The data input-output circuit comprises a temporary data storage circuit for temporarily storing data as input and outputting the data as input, an output buffer connected between the temporary data storage circuit and the input-output terminal of the semiconductor data storage device, and an output control circuit for outputting data to the temporary data storage circuit in order to control an output of the output buffer to a high impedance state when the output buffer and the input-output terminal are separated. A differential amplifier connected to the temporary data storage circuit may be provided in place of the output control circuit for performing the Hi-Z control by precharging or discharging.

20 Claims, 15 Drawing Sheets

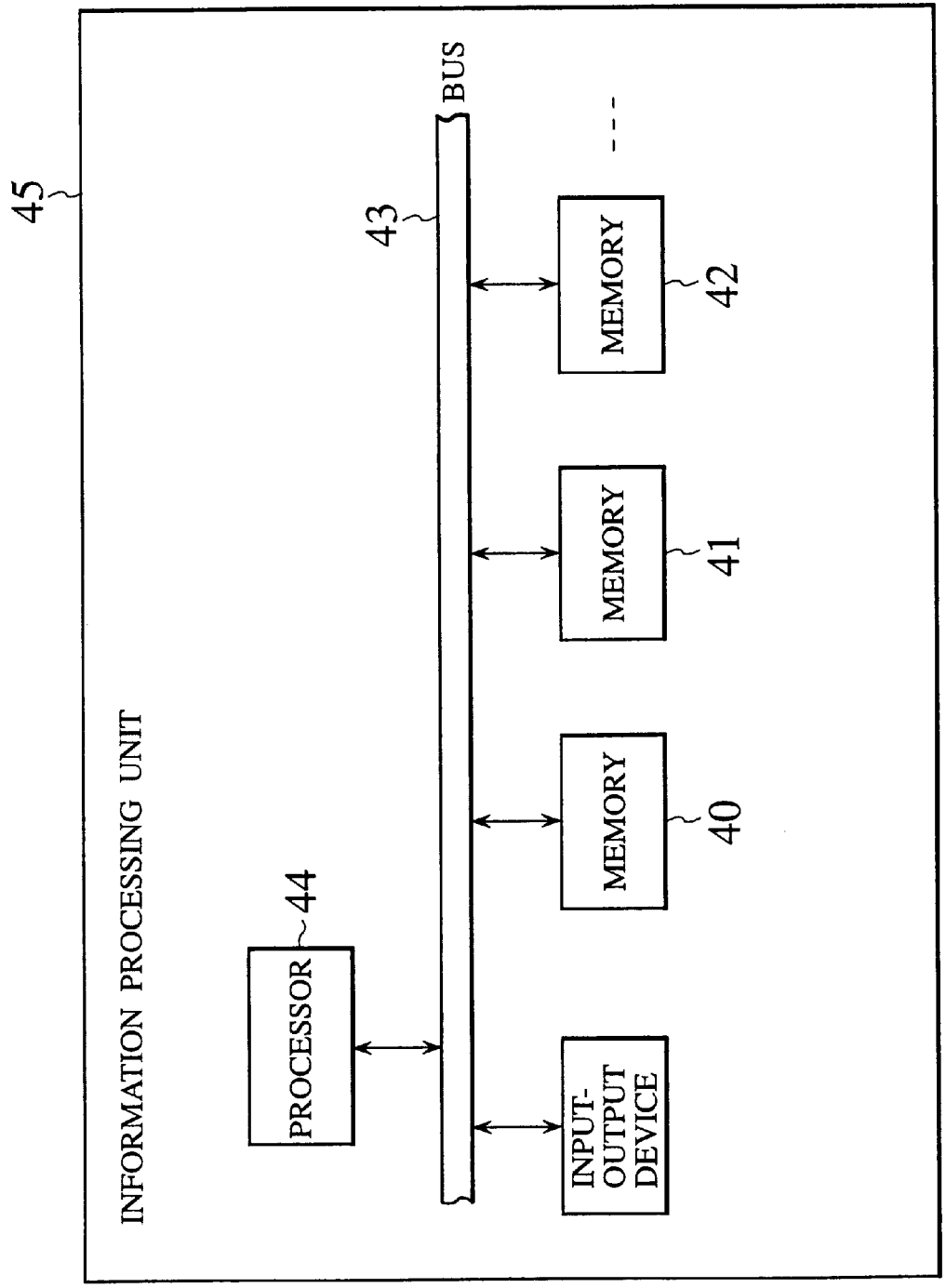

DATA INPUT-OUTPUT CIRCUIT AND SEMICONDUCTOR DATA STORAGE DEVICE PROVIDED THEREWITH

BACKGROUND OF THE INVENTION

1. Field of the Invention

The present invention relates to a data input-output circuit and a semiconductor data storage device provided with the data input-output circuit in which it is possible to improve the speed of the data input-output operation in the semiconductor data storage device connected to a bus.

2. Description of the related art

The semiconductor memories such as DRAMs (Dynamic Random Access Memory), SRAMs (Static Random Access Memory) are provided with input-output terminals as indispensable terminals. Necessary data is input or output through the input-output terminals. There are several types of semiconductor memories from the view point of the configuration of the input-output terminals. Namely, (1) the input terminals and the output terminals are separately provided in the case of one type while (2) common terminals serve as the input terminals when data is to be written into the memory and serves as the output terminals when data is to be read from the memory in the case of another type. In the case of the type (2), the input-output common terminals are connected to both the output nodes of the output buffers and the input nodes of the input buffers. The input-output common terminals serve as the input terminals when data is to be written (input) into the memory and serve as the output terminals when data is to be read (output) from the memory. Accordingly, when data is to be written into the memory, the output of the output buffer has to be changed to a high impedance state so that the output buffer and the input-output common terminals have to be electrically disconnected. On the other hand, the memory of the type (1) with separate input and output terminals, a single bus is sometimes shared by a plurality of memories. In this case, when the output signal of the respective memory has to be selectively transferred to the bus, the output buffers of other memories have to be separated from the output terminals by changing the outputs of the output buffers to the high impedance state.

The output of the output buffer is changed to the high impedance state in an appropriate time during operation of the data input-output circuit of the semiconductor memory so that the output buffer is electrically separated from the input-output terminal in this manner. This control operation is called the Hi-Z control (high impedance state control) in the followings.

Next, with reference to FIG. 1, the Hi-Z control will be explained. FIG. 1 is a block diagram showing an example of the prior art data input-output circuits for use in semiconductor memories. An input-output terminal 101 is connected to both an output node of an output buffer 102 and an input node of an input buffer 103 in the data input-output circuit as illustrated in FIG. 1. Namely, the input-output terminal 101 is an input-output common terminal. The input nodes of the output buffer 102 are connected to a Hi-Z control circuit 104. The Hi-Z control circuit 104 serves to conduct the Hi-Z control for the output buffer 102. The output buffer 102 as illustrated in FIG. 1 consists of n-type MOS transistors 105 and 106 while the Hi-Z control circuit 104 consists of 2-input NOR gate circuit 107 and 108 and an inverter circuit 109.

In the case of the data input-output circuit as illustrated in FIG. 1, the output of the output buffer 102 is changed to the Hi-Z state when an output enable signal (/OE) is in the "H" level. Namely, when the output enable signal /OE is changed to the "H" level signal, the "L" level signal is output from the 2-input NOR gate circuit 107 and 108 each of which receives the output enable signal /OE at one input node thereof, irrespective of the input level at the other input node. Accordingly, the n-type MOS transistors 105 and 106 become non-conductive by receiving the output signals of the 2-input NOR gate circuits 107 and 108. The output of the output buffer 102 is then changed to the Hi-Z state.

On the other hand, when the output enable signal /OE is changed to the "L" level, the data input-output circuit outputs data latched by a register 110 to the input-output terminal 101 through the output buffer 102. For example, in the case that the "H" level data is latched by the register 110, the "L" level signal and the "H" level signal are input respectively to the input nodes of the NOR gate circuit 107 while the "L" level signals are input to both the input nodes of the NOR gate circuit 108. At this time, the NOR gate circuit 107 outputs the "L" level signal while the NOR gate circuit 108 outputs the "H" level signal. Accordingly, the "L" level signal of the NOR gate circuit 107 is input to the gate of the n-type MOS transistor 105, which is then changed to the non-conductive state. On the other hand, the "H" level signal of the NOR gate circuit 108 is input to the gate of the MOS transistor 106, which is then changed to the conductive state. The input-output terminal 101 is connected to the ground level through the n-type MOS transistor 106 and receives the "L" level signal.

However, there are shortcomings in the prior art data input-output circuit in as follows. The output enable signal /OE is generated by an output enable signal control circuit 111 in synchronism with the clock signal CLK. On the other hand, the register 110 receives the clock signal CLK and outputs data in synchronism with the clock signal CLK. Accordingly, the Hi-Z control as conducted by the Hi-Z control circuit 104 and the outputting operation of the register 110 are synchronized with each other. However, it is sometimes the case that the output enable signal control circuit 111 outputs the output enable signal /OE with a skew resulting in timing mismatch between the clock signal CLK and the output enable signal /OE as generated. Because of this, in the actual case, the Hi-Z control as conducted by the Hi-Z control circuit 104 and the outputting operation of the register 110 are not exactly synchronized with each other.

FIG. 2 is a timing chart showing data outputting operation of the data input-output circuit as illustrated in FIG. 1. There is a time interval between the time at which the output of the output buffer 102 becomes the Hi-Z state and the time at which the output buffer 102 stops outputting data "D3", as illustrated in FIG. 2. Ideally speaking, the data outputting period as defined by the output enable signal /OE shall terminate in the time at which the output buffer 102 stops outputting data "D3". However, in the actual case, the data outputting period is elongated by time t1. This mismatch results in the undesirable operation that the use of the input-output terminal 101 is released only with delay time t1. The next operation (e.g., data input operation) is therefore postponed by the delay time t1. Furthermore, for the same reason, the time delay between the rising edge of the clock signal CLK and the start of outputting data "D1" is longer than the time delay between the rising edge of the clock signal CLK and the start of outputting data "D2" and the time delay between the rising edge of the clock signal CLK and the start of outputting data "D3" for only time t2. This is one of major problems in the quest for faster data transfer between a memory and a processor in a computer system.

SUMMARY OF THE INVENTION

The present invention has been made in order to solve the shortcomings as described above. It is an important object of the present invention to provide an improved data input-output circuit for making it possible to improve the speed of the data input-output operation by synchronizing the data outputting operation and the Hi-Z control.

It is another associated object of the present invention to provide an improved data input-output circuit for making it possible to improve the speed of the data input-output with a simplified structure.

It is further associated object of the present invention to provide a semiconductor data storage device comprised of such an improved data input-output circuit.

In brief, in accordance with the characterizing feature of a first invention, the above and other objects and advantages of the present invention are provided by a new and improved data input-output circuit of a semiconductor data storage device comprising: a temporary data storage circuit for temporarily storing data as input and outputting the data as input, an output buffer connected between the temporary data storage circuit and an input-output terminal of the semiconductor data storage device, and an output control circuit for outputting data to the temporary data storage circuit in order to control an output of the output buffer to a high impedance state when the output buffer and the input-output terminal are separated.

In accordance with the first invention, data latched on to the temporary data storage circuit is output through the output buffer to the input-output terminal when data is to be output. On the other hand, when data is not to be output, the output control circuit outputs predetermined data to the temporary data storage circuit for the Hi-Z control while the output terminal of the output buffer is changed to be the high impedance state by receiving the predetermined data. Namely, both the data output operation and the Hi-Z control are performed by the temporary data storage circuit. Accordingly, it is possible to improve the speed of the data input-output by getting rid of timing mismatch between the data outputting operation and the Hi-Z control.

In accordance with the characterizing feature of a second invention a new and improved data input-output circuit of a semiconductor data storage device comprising: a temporary data storage circuit for temporarily storing data as input through an amplifier and outputting the data as input and an output buffer connected between the temporary data storage circuit and the input-output terminal of the semiconductor data storage device, wherein the amplifier controls the output of the output buffer to a high impedance state when the output buffer and the input-output terminal are separated.

In accordance with the second invention, the amplifier outputs predetermined data to the temporary data storage circuit for the Hi-Z control while the output of the output buffer is changed to the high impedance state by receiving the predetermined data. Namely, the amplifier as part of the data input-output circuit is used for performing the Hi-Z control so that it is possible to dispense with a particular circuit provided for the purpose of the Hi-Z control. Accordingly, it possible to realize a data input-output circuit with a simplified structure.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF DRAWINGS

FIG. 15 is a block diagram showing one example of an information processing unit provided with a plurality of semiconductor data storage devices in accordance with the present invention.

DETAILED DESCRIPTION OF EMBODIMENTS

Figure 1:
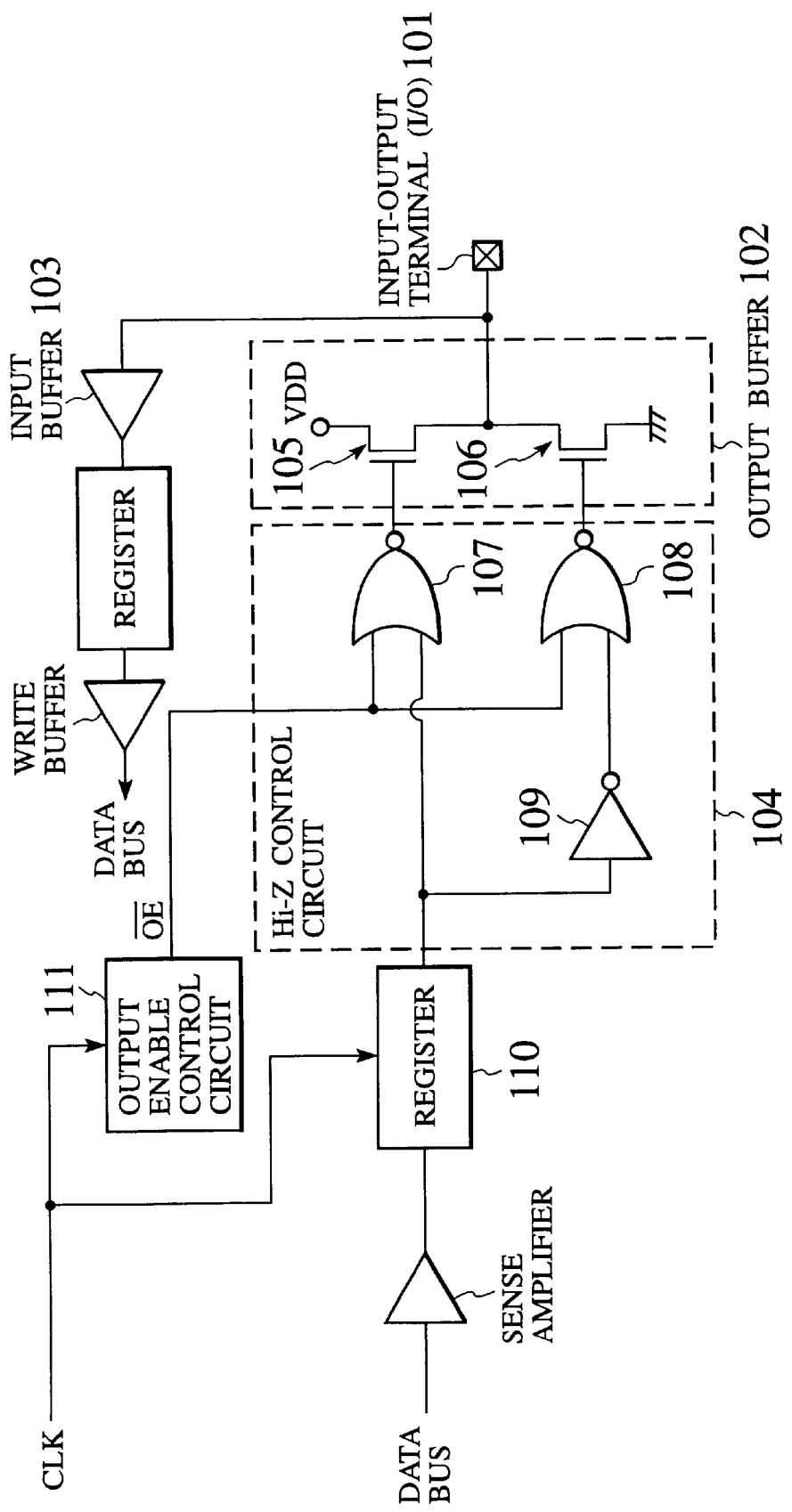
FIG. 1 is a block diagram showing an example of the prior art data input-output circuits for use in semiconductor memories.
Figure 2:
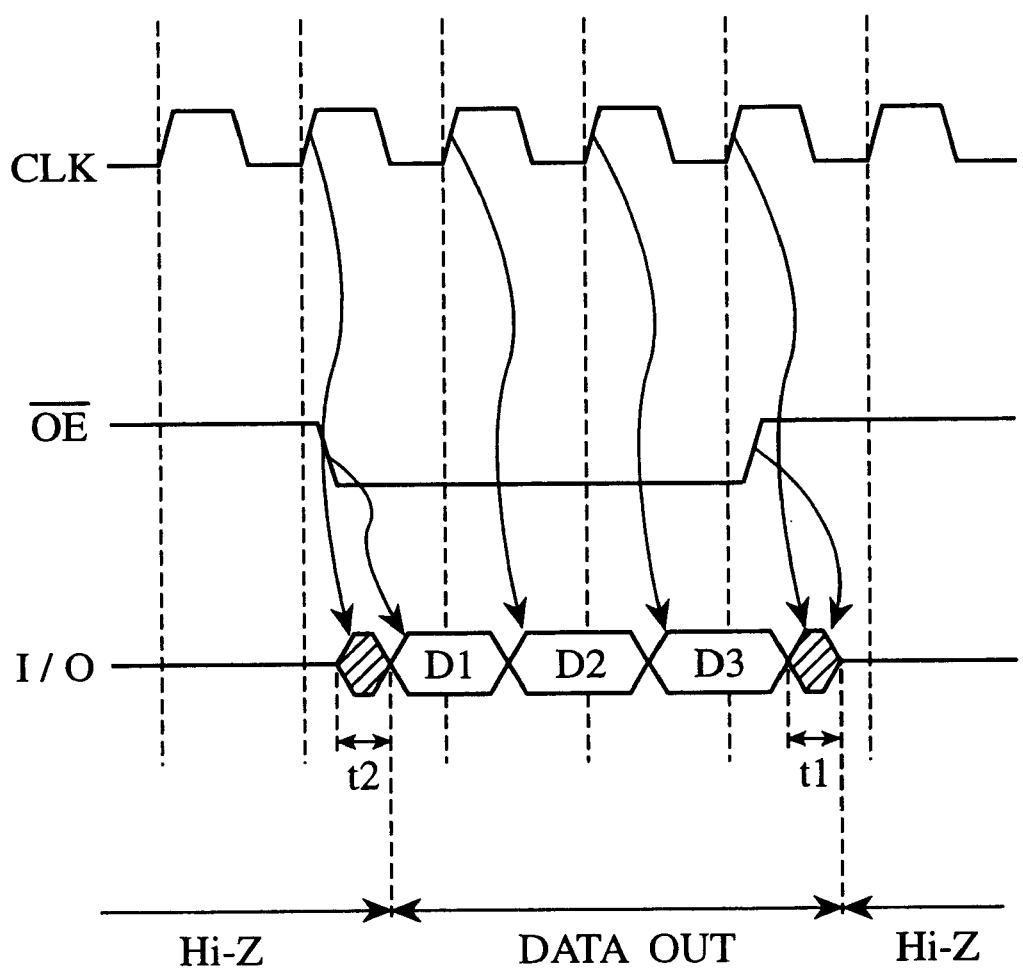
FIG. 2 is a timing chart showing data outputting operation in the data input-output circuit as illustrated in FIG. 1.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

Figure 3:
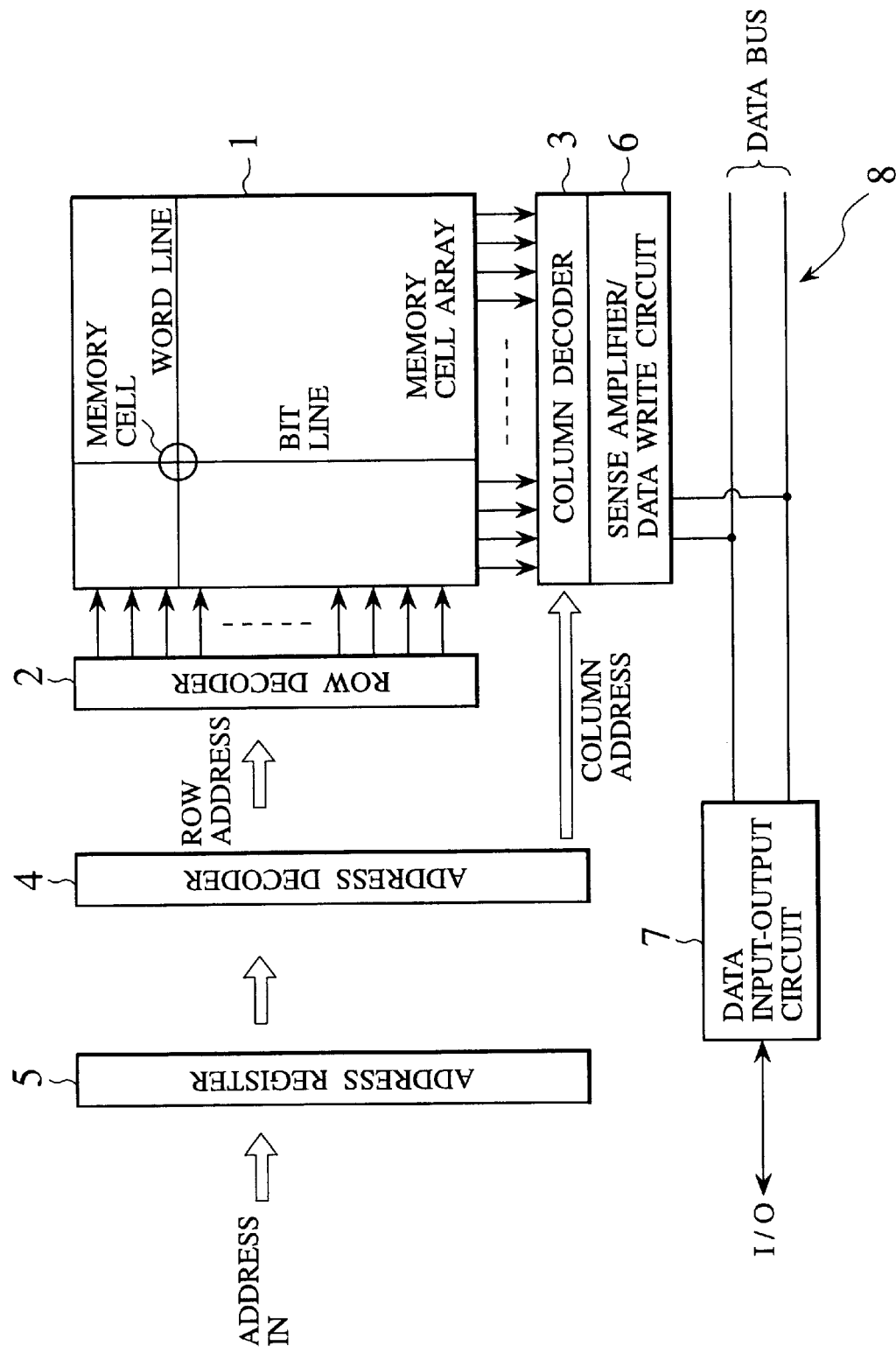
FIG. 3 is a block diagram showing one example of a semiconductor data storage device provided with the data input-output circuit in accordance with an embodiment of the present invention.

FIG. 3 is a block diagram showing an exemplary semiconductor data storage device provided with the data input-output circuit in accordance with a first embodiment of the present invention. In FIG. 3, a number of memory cells are regularly arranged in a memory cell array 1 in the form of a matrix. Each memory cell serves to store binary information, i.e., either one of the "H" level signal or the "L" level signal. Also, each memory cell is comprises of, e.g., one transistor and one capacitance in the case of a DRAM, or a CMOS cell in the case of an SRAM. Data stored in each memory cell is selected by activating one (or more) of word lines extending in the direction of the rows of the matrix and selecting bit lines (or data lines) extending in the direction of the columns of the matrix. A word line is selected by a row decoder 2 while the bit lines are selected by a column decoder 3. Appropriate word and bit lines are selected by the row decoder 2 and the column decoder 3 in accordance with a row addressing signal and a column addressing signal as generated by an address decoder 4. Each bit line is connected to the sense amplifier/data write circuit 6. The sense amplifier 6 amplifies data as read out from the memory cell. On the other hand, the data write circuit 6 serves to write data to the memory cell. The data input-output circuit 7 in accordance with the first embodiment of the present invention functions as a control circuit for controlling the read/write operation of the memory cell as selected. In the case of the read operation, the data input-output circuit 7 transfers data of the memory cell as selected to the input-output terminal I/O through the data bus 8 while, in the case of the write operation, the data input-output circuit 7 transfers data as input from the input-output terminal I/O to the memory cell as selected through the data bus 8.

Figure 4:
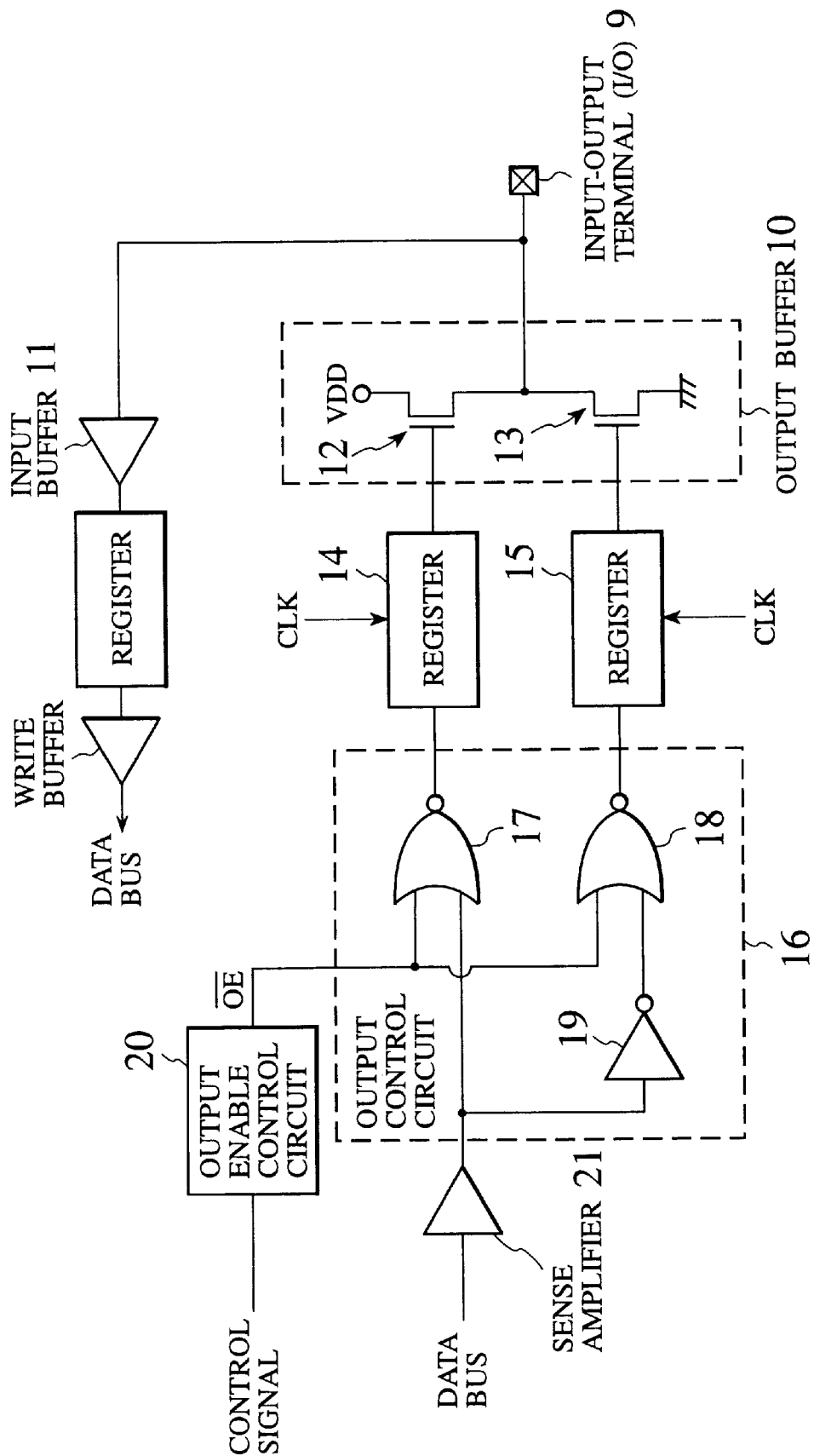
FIG. 4 is a block diagram showing the data input-output circuit in accordance with the first embodiment of the present invention.

FIG. 4 is a block diagram showing the data input-output circuit in accordance with the first embodiment of the present invention. The input-output terminal 9 are connected to both an output node of an output buffer 10 and an input node of an input buffer 11, as illustrated in FIG. 4. The output buffer 10 as illustrated consists of an n-type MOS transistors 12 and an n-type MOS transistor 13. The n-type MOS transistor 12 is a transistor for pulling up the output node of the output buffer 10 while the n-type MOS transistor 13 is a transistor for pulling down the output node of the output buffer 10. The n-type MOS transistors 12 and 13 are connected in series between the power potential VDD (the "H" level) and the ground potential (the "L" level). The gate of the n-type MOS transistor 12 is connected to the output node of the register 14 while the source thereof is connected to the power potential VDD. Also, the drain of the n-type MOS transistor 12 is connected to the input-output terminal 9 as the output node of the output buffer 10. On the other hand, the gate of the n-type MOS transistor 13 is connected to the output node of the register 15 while the source thereof is connected to the ground potential. Also, the drain of the n-type MOS transistor 13 is connected to the input-output terminal 9 as the output node of the output buffer 10. The input nodes of the registers 14 and 15 are connected to the output nodes of the output control circuit 16, which conducts the Hi-Z control and the data outputting operation.

The output control circuit 16 is composed of 2-input NOR gate circuits 17 and 18 and an inverter circuit 19. The output control circuit 16 receives the output enable signal /OE and performs the Hi-Z control and the data outputting operation on the basis of the output enable signal /OE. When the output enable signal /OE is in the "H" level, the "L" level signals are output from the 2-input NOR gate circuits 17 and 18 each of which receives the output enable signal /OE at one input node thereof, irrespective of the input level at the other input node. The registers 14 and 15 receive the "L" level signals as output from the 2-input NOR gate circuits 17 and 18 and latch the "L" level signal. On the other hand, the registers 14 and 15 receive the clock signal CLK and output data in synchronism with the clock signal CLK. Accordingly, the n-type MOS transistors 12 and 13 respectively receive the "L" level signal at the gates thereof and become non-conductive. The output of the output buffer 10 is changed to the Hi-Z state in synchronism with the clock signal CLK.

On the other hand, when the output enable signal /OE is changed to the "L" level, in the case that data as selected is the "H" level signal, the input signals of the NOR gate circuit 17 are the "L" level signal and the "H" level signal, while the input signals of the NOR gate circuit 18 are the "L" level signals respectively. At this time, the NOR gate circuit 17 outputs the "L" level signal while the NOR gate circuit 18 outputs the "H" level signal. As a result, the "L" level signal is latched by the register 14 while the "H" level signal is latched by the register 15. The registers 14 and 15 output data as selected in synchronism with the clock signal CLK. Accordingly, the n-type MOS transistor 12 receiving the "L" level signal through the gate becomes the non-conductive state while the n-type MOS transistor 13 receiving the "H" level signal through the gate becomes the conductive state. The input-output terminal 9 is connected to the ground level through the n-type MOS transistor 13. Data of the "L" level signal is output to the input-output terminal 9. Meanwhile, the output enable signal /OE is generated on the basis of a predetermined control signal by a suitable output enable signal control circuit 20.

Figure 5:
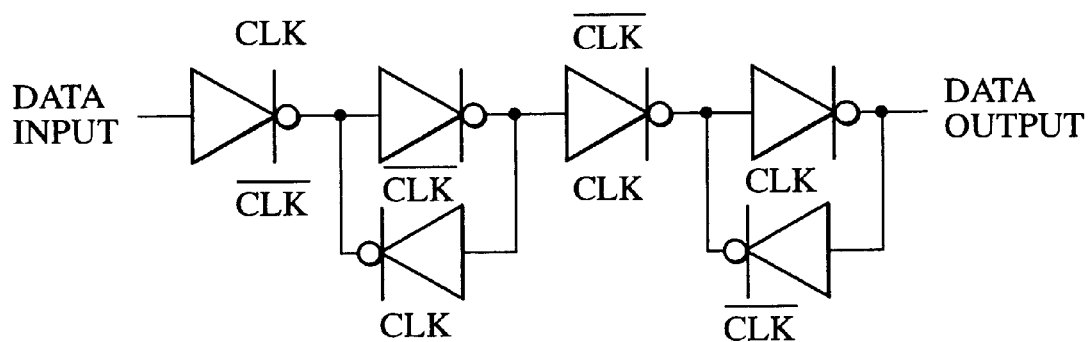
FIG. 5 is a circuit diagram showing an exemplary design of the register of the data input-output circuit in accordance with the embodiment of the present invention.

The registers 14 and 15 are storage devices for temporarily storing data and can be formed in any circuit design as long as data stored is output in synchronism with the clock signal as supplied from an external device. One example is shown in FIG. 5.

In accordance with the first embodiment of the present invention, since the outputting operation of the output buffer 10 and the Hi-Z control of the output of the output buffer 10 are synchronized with each other, these operations are performed in an exactly synchronized manner. Accordingly, the time at which the output of the output buffer 10 becomes the Hi-Z state exactly coincides with the time at which the output buffer 10 stops outputting data. Furthermore, the time at which the output buffer 10 starts using the data bus exactly coincides with the time at which the output buffer 10 initiates outputting data. By this configuration, there is no undesirable useless time period in the data outputting period so that high speed data transfer operation becomes possible.

(Second Embodiment)

Figure 6:
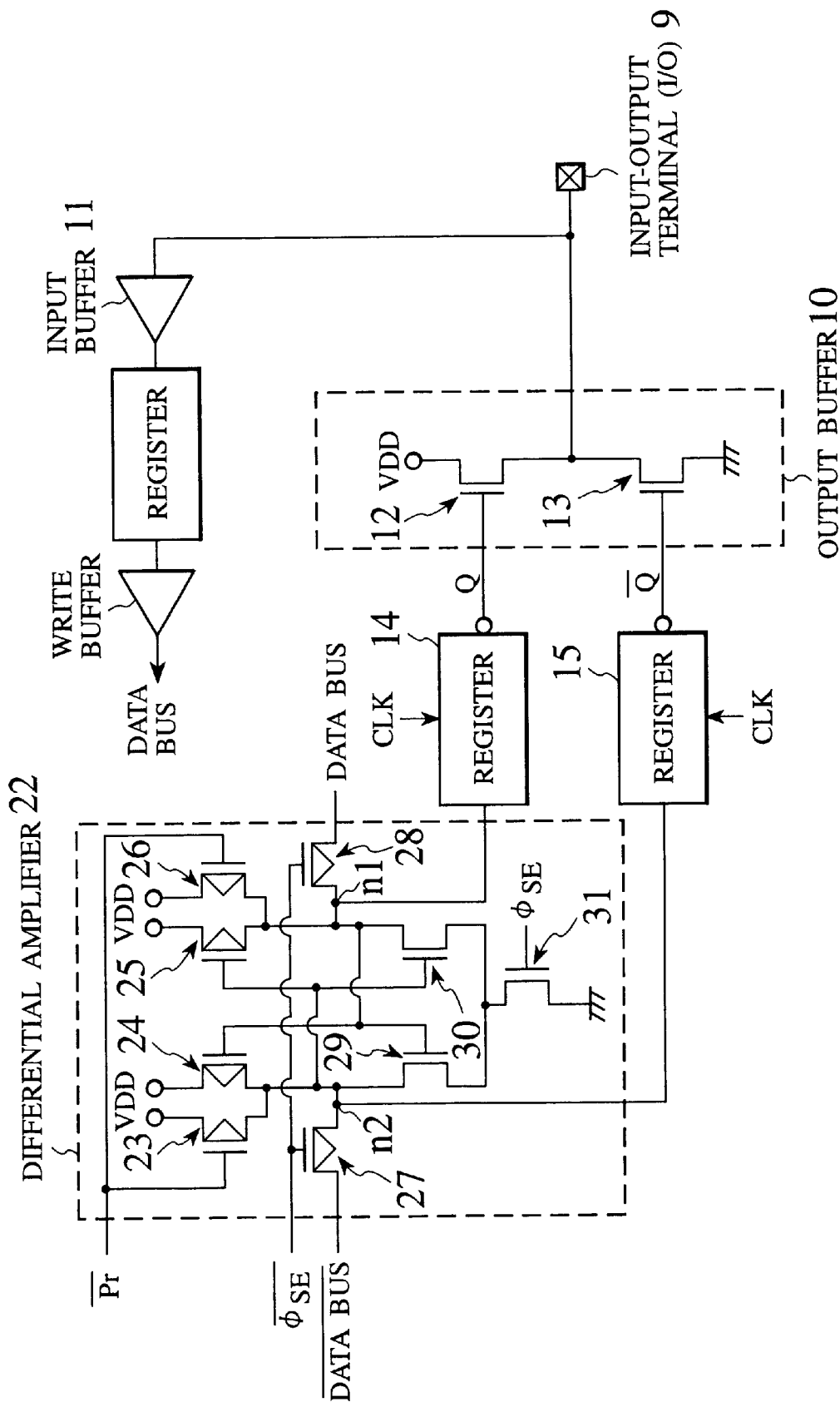
FIG. 6 is a block diagram showing the data input-output circuit in accordance with the second embodiment of the present invention.

Next, the second embodiment of the present invention will be explained. FIG. 6 is a block diagram showing the data input-output circuit in accordance with the second embodiment of the present invention in which similar references are given to similar elements as in FIG. 4. In the second embodiment of the present invention, the sense amplifier 21 as illustrated in FIG. 4 of the first embodiment of the present invention is replaced by an synchronous differential amplifier 22 while the output control circuit 16 and the output enable signal control circuit 20 as illustrated in FIG. 4 are dispensed with. In the data input-output circuit in accordance with the second embodiment of the present invention, the potential level of the reference node n1 of the synchronous differential amplifier 22 is given to the register 14 while the reference node n2 is given to the register 15 in order to perform the Hi-Z control of the output of the output buffer 10 and the data outputting operation of the output buffer 10.

Figure 7:
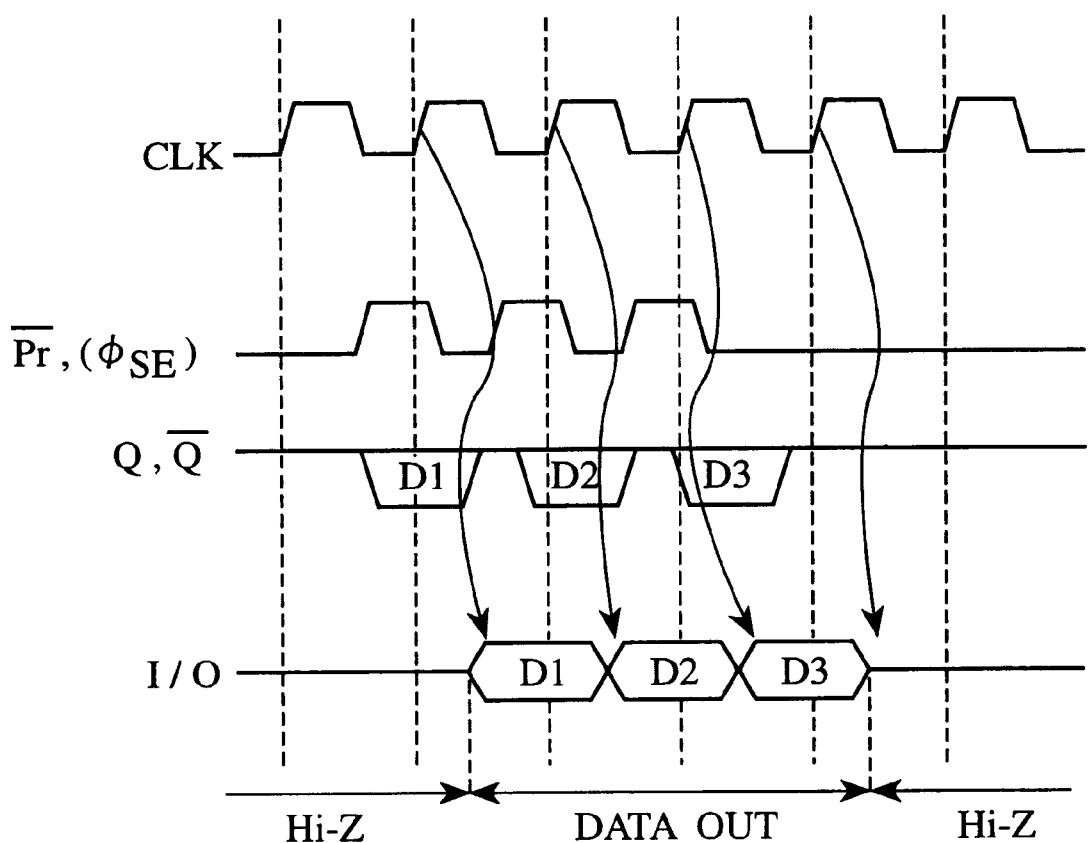
FIG. 7 is a timing chart showing the data outputting operation of the data input-output circuit in accordance with the second embodiment of the present invention.

Next, the operation of the second embodiment of the present invention will be explained. FIG. 7 is a timing chart showing the data outputting operation of the data input-output circuit in accordance with the second embodiment of the present invention. In this case, a sense signal φ SE is the inverted signal /Pr of a precharging signal Pr. In FIG. 6, when the precharging signal Pr is changed to the "H" level signal, i.e, when the inverted signal /Pr of the precharging signal Pr and the sense signal φ SE are changed to the "L" level signal and the inverted signal /φ SE of the sense signal φ SE is changed to the "H" level signal, the p-type MOS transistors 23 and 26 receive the inverted signal /Pr of the precharging signal Pr at their gates and becomes their conductive states. The n-type MOS transistor 29 receives the power potential VDD (the "H" level signal) at its gate through the p-type MOS transistor 26 while the n-type MOS transistor 30 receives the power potential VDD at its gate through the p-type MOS transistor 23. As a result, both the n-type MOS transistors 29 and 30 becomes their conductive state. On the other hand, the p-type MOS transistor 24, 25, 27 and 28 and the n-type MOS transistor 31 are in the non-conductive state. Accordingly, the nodes n1 and n2 are precharged to the "H" level.

The register 16 receives the potential level of the node n1 while the register 17 receives the potential level of the node n2. As a result, the "H" level signal are latched respectively by the registers 16 and 17. The registers 16 and 17 output the "L" level data as the inverted data of data as selected to the output buffer 10 in synchronism with the clock signal CLK. The n-type MOS transistors 12 and 13 receive the "L" level signals at the gates thereof, and therefore become the non-conductive state. Namely, the output of the output buffer 10 becomes the Hi-Z state.

On the other hand, when the precharging signal Pr is changed to the "L" level signal, i.e, when the inverted signal /Pr of the precharging signal Pr and the sense signal φ SE are changed to the "H" level signal, the p-type MOS transistors 23 and 26 receive the inverted signal /Pr of the precharging signal Pr at their gates and become the non-conductive state. On the other hand, the p-type MOS transistors 27 and 28 receiving the inverted signal /φ SE of the sense signal φ SE through the gates thereof and the n-type MOS transistor 31 receiving the sense signal φ SE through its gate become conductive. The potential level of the node n1 is changed to the level as read out to the data bus through the p-type MOS transistor 28. The potential level of the node n2 is changed to the inverted level of that read out to the data bus through the p-type MOS transistor 27. The potential levels of the nodes n1 and n2 are finely amplified by means of the p-type MOS transistor 24 and 25 and the n-type MOS transistor 29 and 30. The potential levels of the nodes n1 and n2 are latched on to the registers 14 and 15 as complementary data. The registers 14 and 15 output complementary signals Q and /Q to the output buffer 10 in synchronism with the clock signal CLK. The output buffer 10 serves to let one of the n-type MOS transistors 12 and 13 conductive and the other non-conductive in order to output necessary data to the input-output terminal 9. When the precharging signal Pr is changed to the "H" level, the next data is to be accessed and output to the input-output terminal 9 in the same manner.

Figure 8:
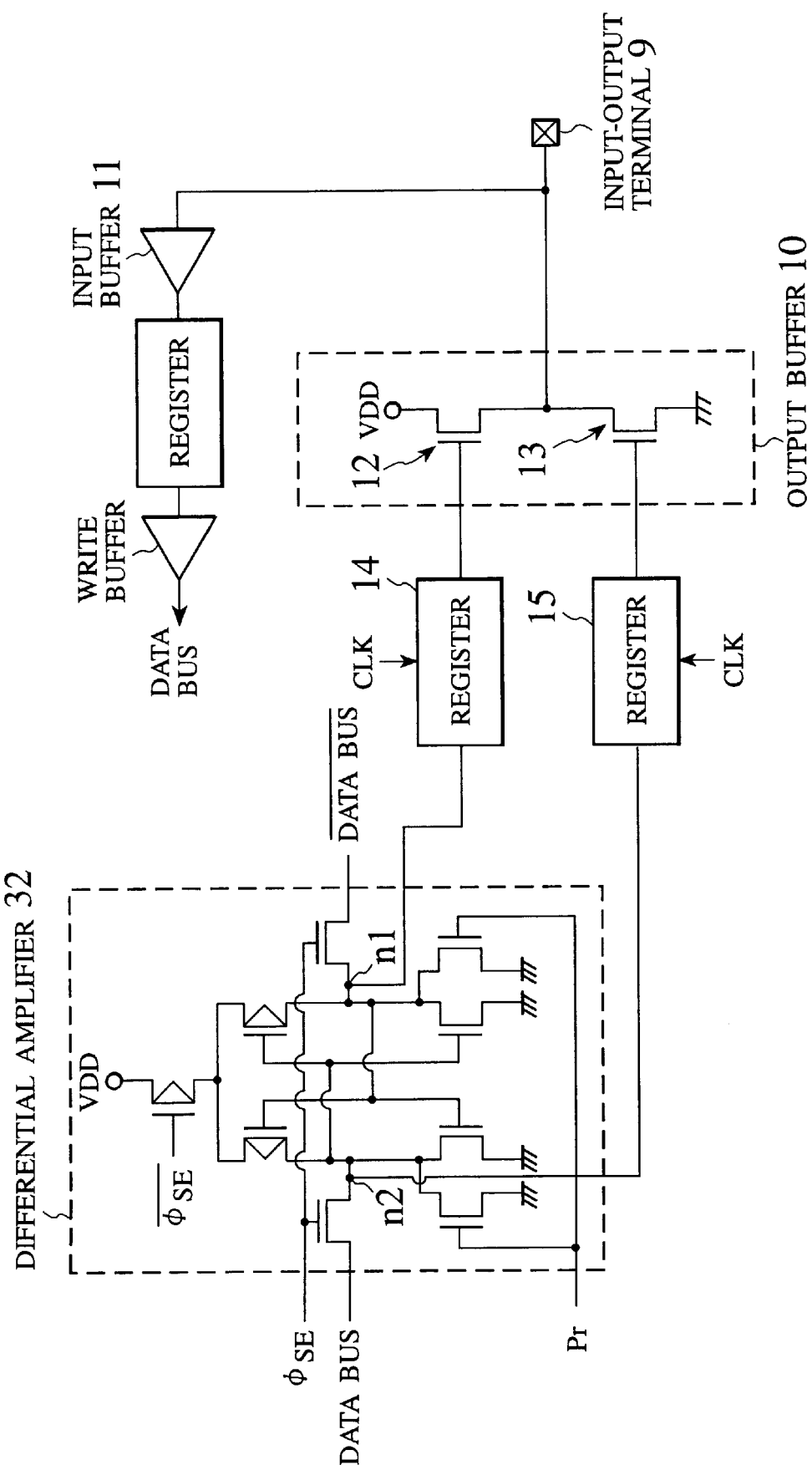
FIGS. 8, 9, 10, 11, 12, 13 and 14 are block diagrams showing modifications of the data input-output circuit in accordance with the second embodiment of the present invention.

The differential amplifier 22 as illustrated in FIG. 6 is a precharge type device which pulls up the reference nodes n1 and n2 to the power potential VDD (the "H" level) in advance. However, the differential amplifier 22 can be designed in the form of a discharge type device which pulls down the reference nodes n1 and n2 to the ground potential (the "L" level) in advance. FIG. 8 is a block diagram showing the configuration of the data input-output circuit designed with the differential amplifier 32 of the discharge type. In the data input-output circuit as illustrated in FIG. 8, when the precharging signal Pr is changed to "H" level (the sense signal φ SE is changed to the "L" level while the inverted signal /φ SE is changed to "H" level), the nodes n1 and n2 are discharged to the "L" level.

The register 14 receives the potential level of the node n1 while the register 15 receives the potential level of the node n2. As a result, the "L" level data is latched on to the registers 14 and 15 respectively. The registers 14 and 15 output the "L" level signal to the output buffer 10 respectively in synchronism with the clock signal CLK. The gates of the n-type MOS transistors 12 and 13 receive the "L" level signals so that the two n-type MOS transistors become non-conductive. Namely, the output of the output buffer 10 becomes the Hi-Z state.

On the other hand, when the precharging signal Pr is changed to the "L" level signal, i.e, when the sense signal φ SE are changed to the "H" level signal and the inverted signal /φ SE of the sense signal is changed to the "L" level signal, the potential level of the node n1 is changed to the inverted level of the potential level of data as read out from the data bus. Furthermore, the potential level of the node n2 is changed to the potential level of data as read out from the data bus. The potential level of the nodes n1 and n2 are latched on to the input nodes of the registers 14 and 15 as complementary data. The registers 14 and 15 output complementary data to the output buffer 10 in synchronism with the clock signal CLK. The output buffer 10 receiving the complementary data outputs data by making the n-type MOS transistors 12 and 13 conductive and the other non-conductive in order to output necessary data to the input-output terminal 9.

In accordance with the second embodiment of the present invention, the outputting operation of the output buffer 10 and the Hi-Z control of the output of the output buffer 10 are synchronized with each other. The data outputting operation and the Hi-Z control are performed in an exactly synchronized manner. Accordingly, the time at which the output of the output buffer 10 becomes the Hi-Z state exactly coincides with the time at which the output buffer 10 stops outputting data, and therefore there is no undesirable useless time period in the data outputting period. As a result, high speed data transfer operation becomes possible. Furthermore, since it is possible to make use of the potential level of the synchronous differential amplifier having been provided in the data input-output circuit in accordance with the second embodiment of the present invention, the circuit configuration can be simplified. As a result, it becomes not the case that the cycle time and the cost performance shall be deteriorated.

(Modifications of the First and Second Embodiments)

While the present invention has been described in terms of presently preferred embodiments, i.e, the first and second embodiment, those skilled in the art will recognize that the method and apparatus of the present invention can be practiced with modification and alteration in a number of applications in view of the description. The description is thus to be regarded as illustrative instead of limiting on the present invention.

Figure 9:
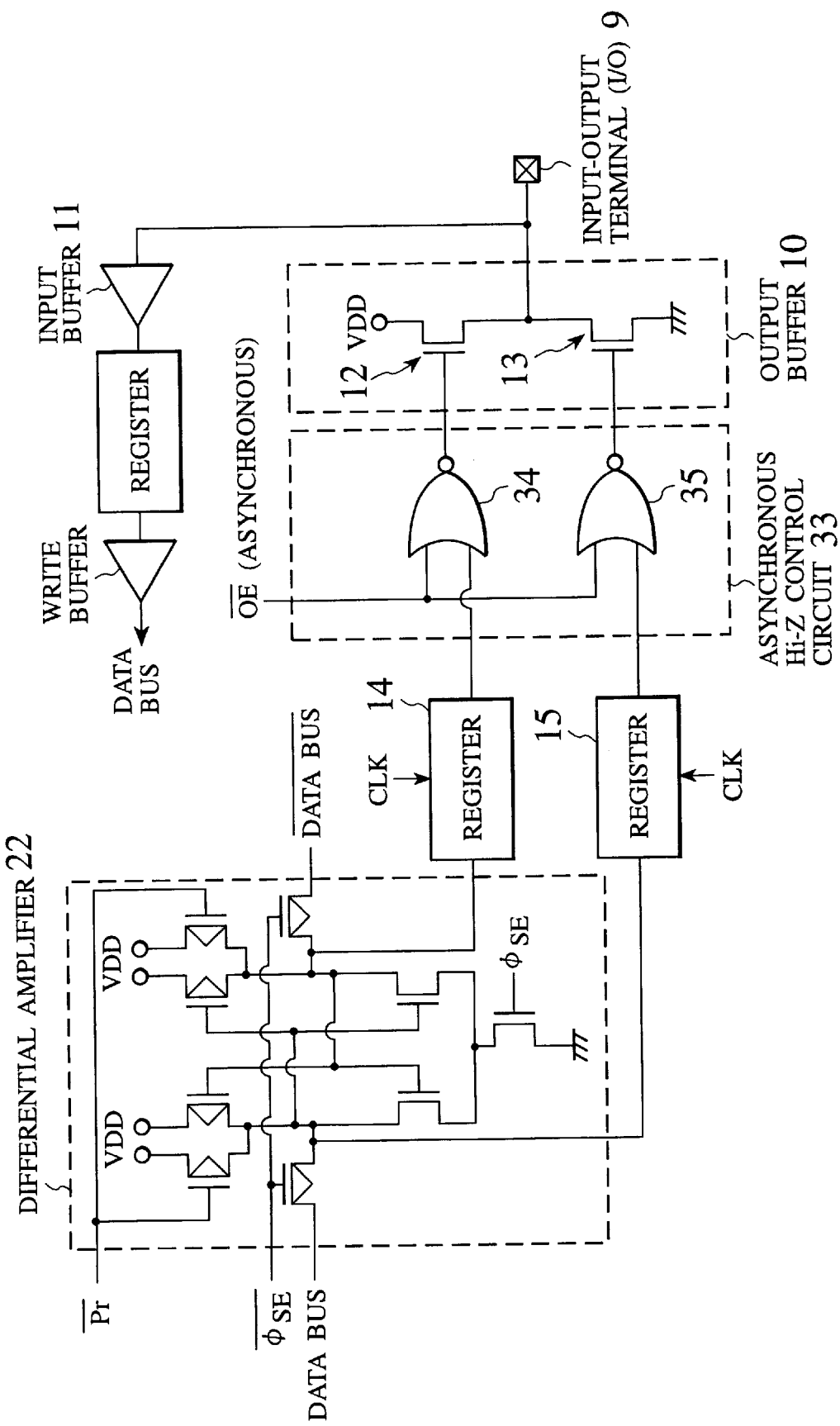
Figure 10:
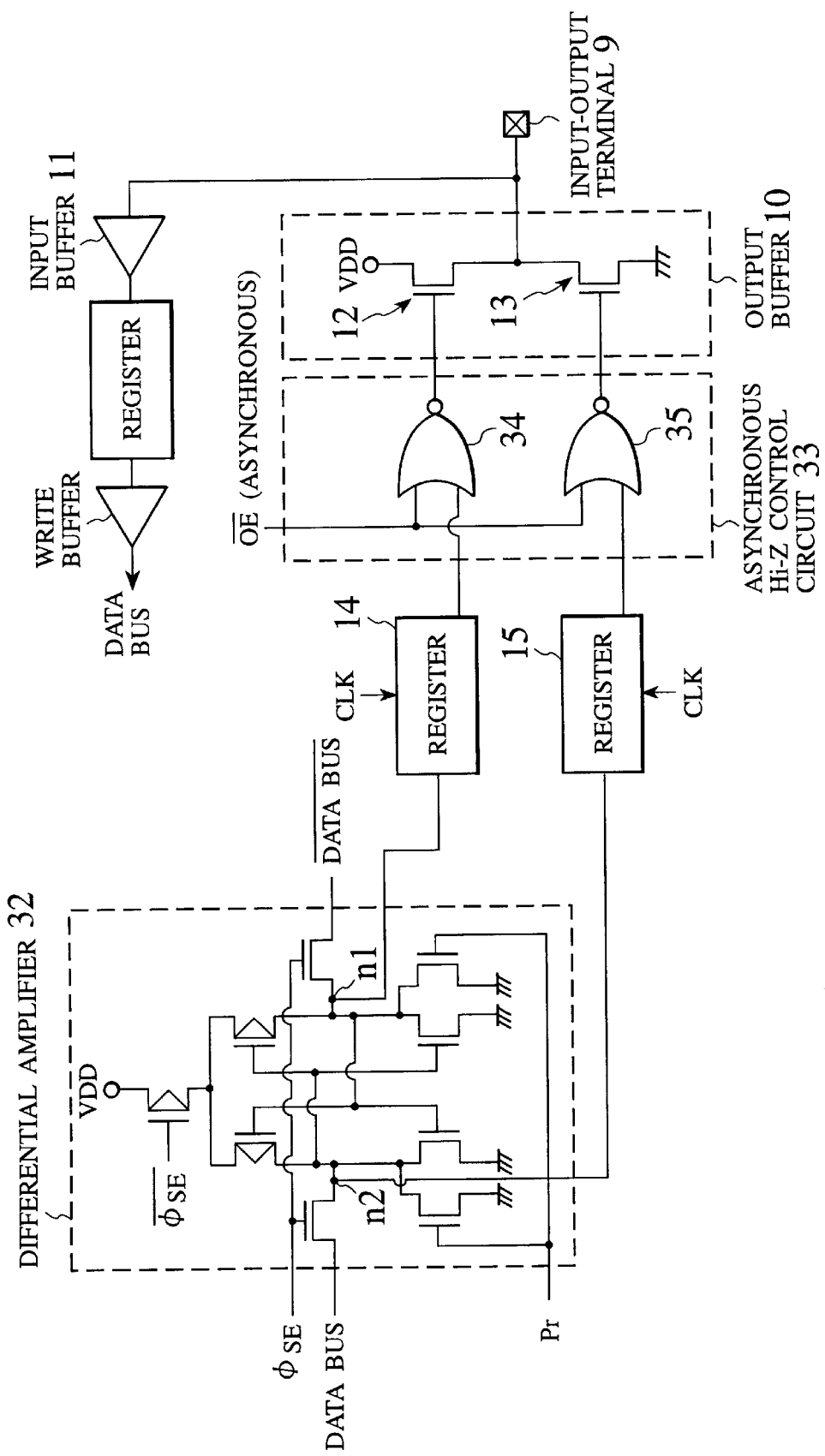

For example, as illustrated in FIG. 9 and FIG. 10, the Hi-Z control of the output buffer 10 becomes possible asynchronous with the clock signal CLK by providing an asynchronous Hi-Z control circuit 33 between the registers 14 and 15 and the output buffer 10 as illustrated in FIG. 6 and FIG. 8 and making use of an asynchronous output enable signal /OE. The asynchronous Hi-Z control circuit 33 is, for example, composed of 2-input NOR gate circuits 34 and 35.

Figure 11:
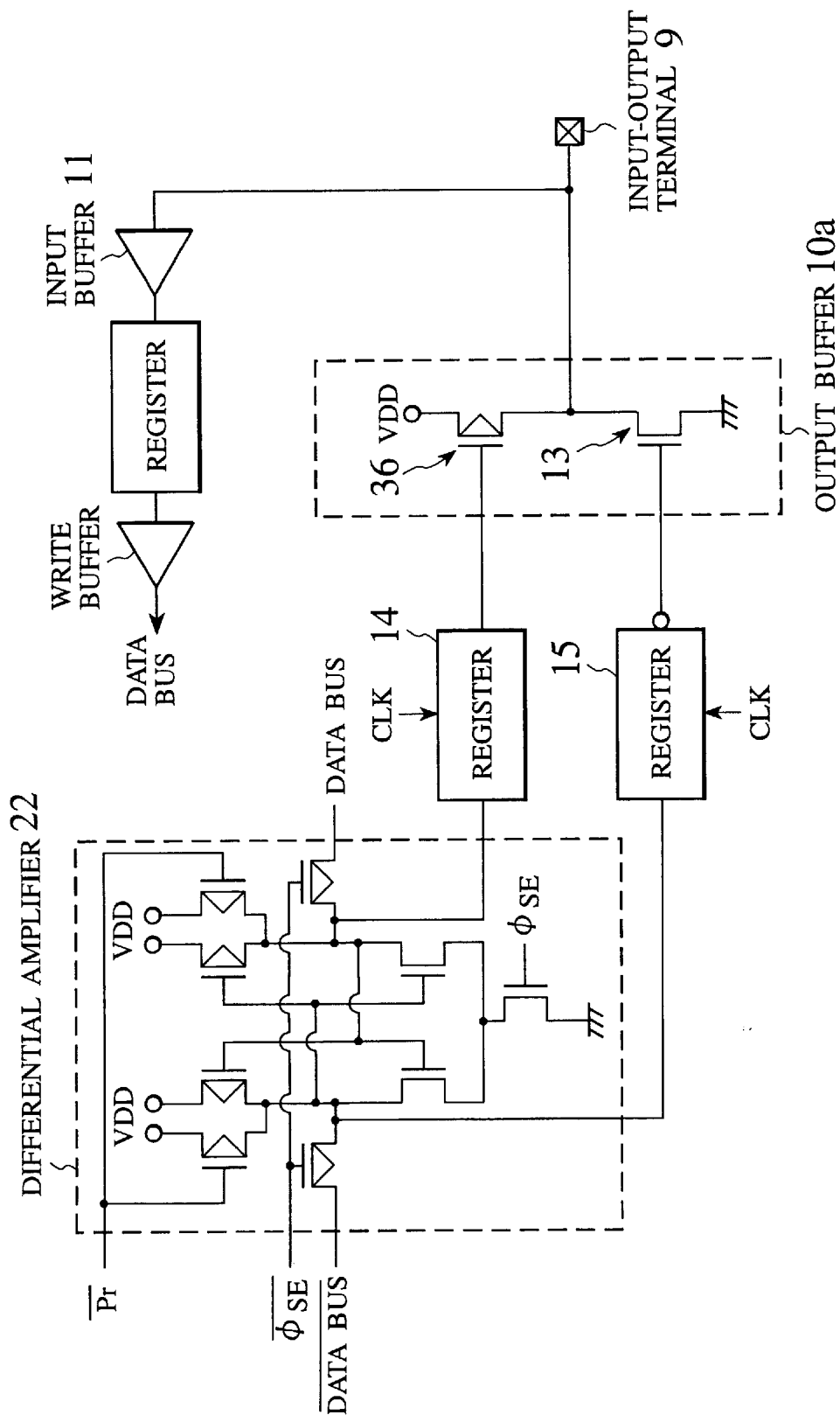
Figure 12:
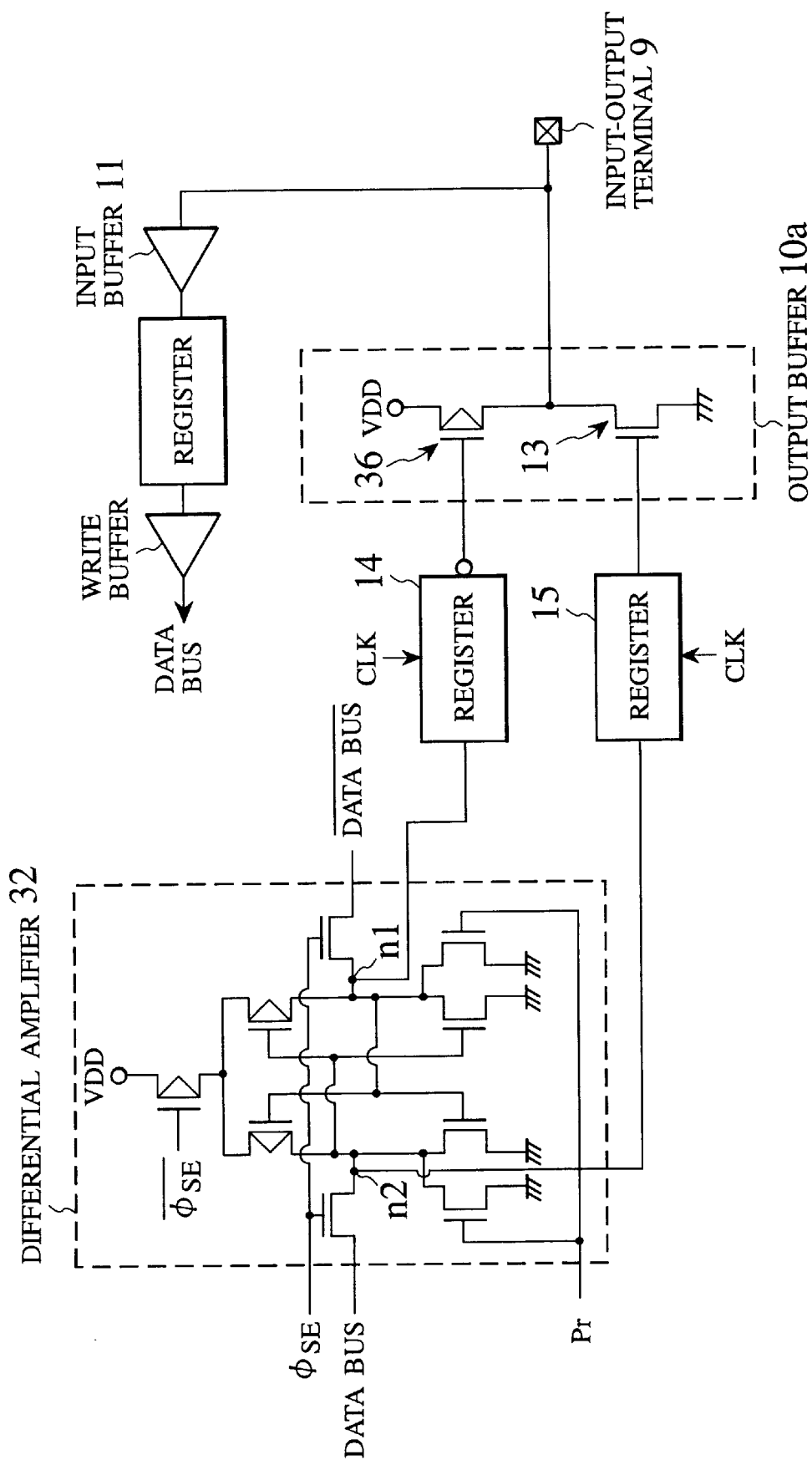
Figure 13:
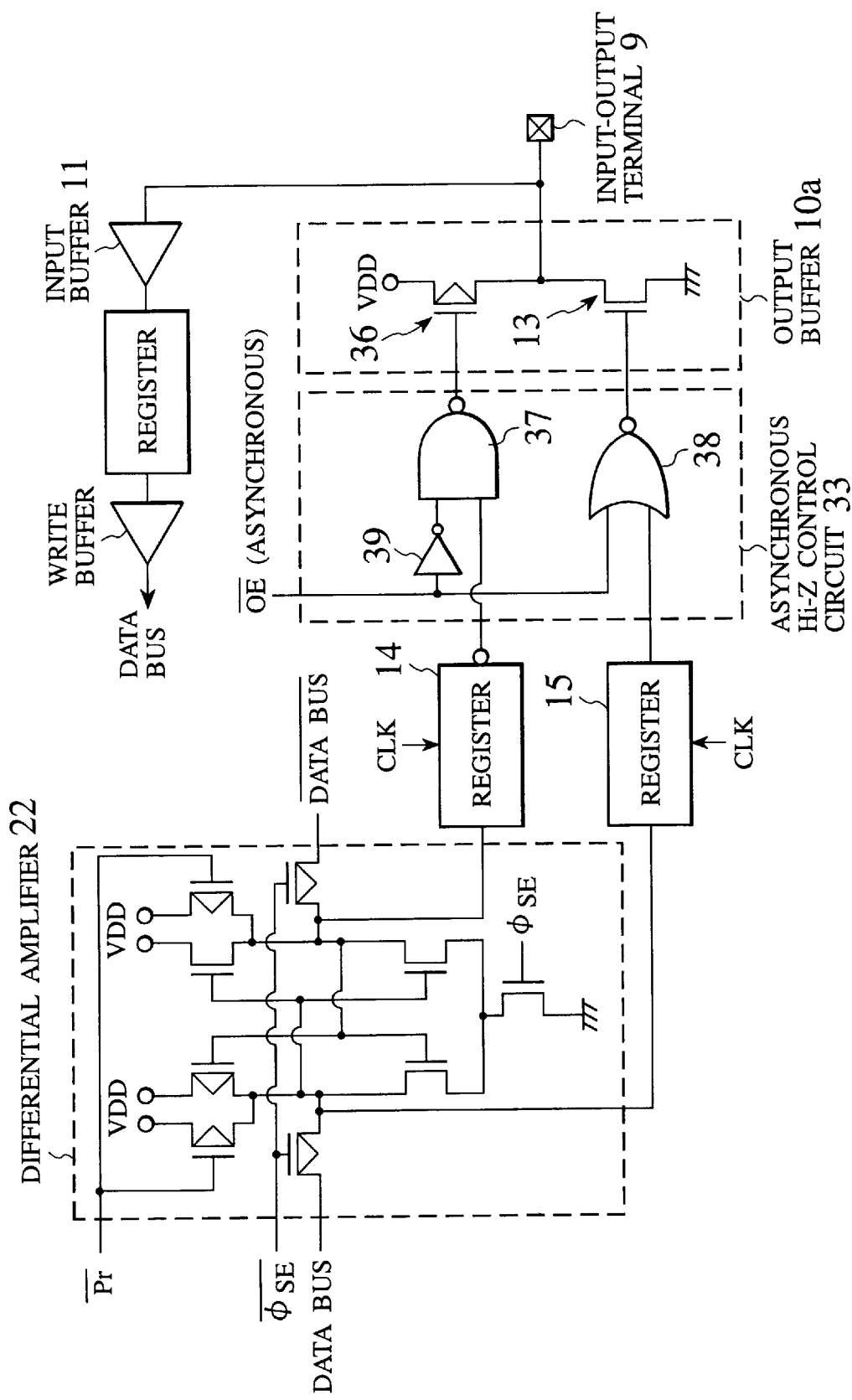
Figure 14:
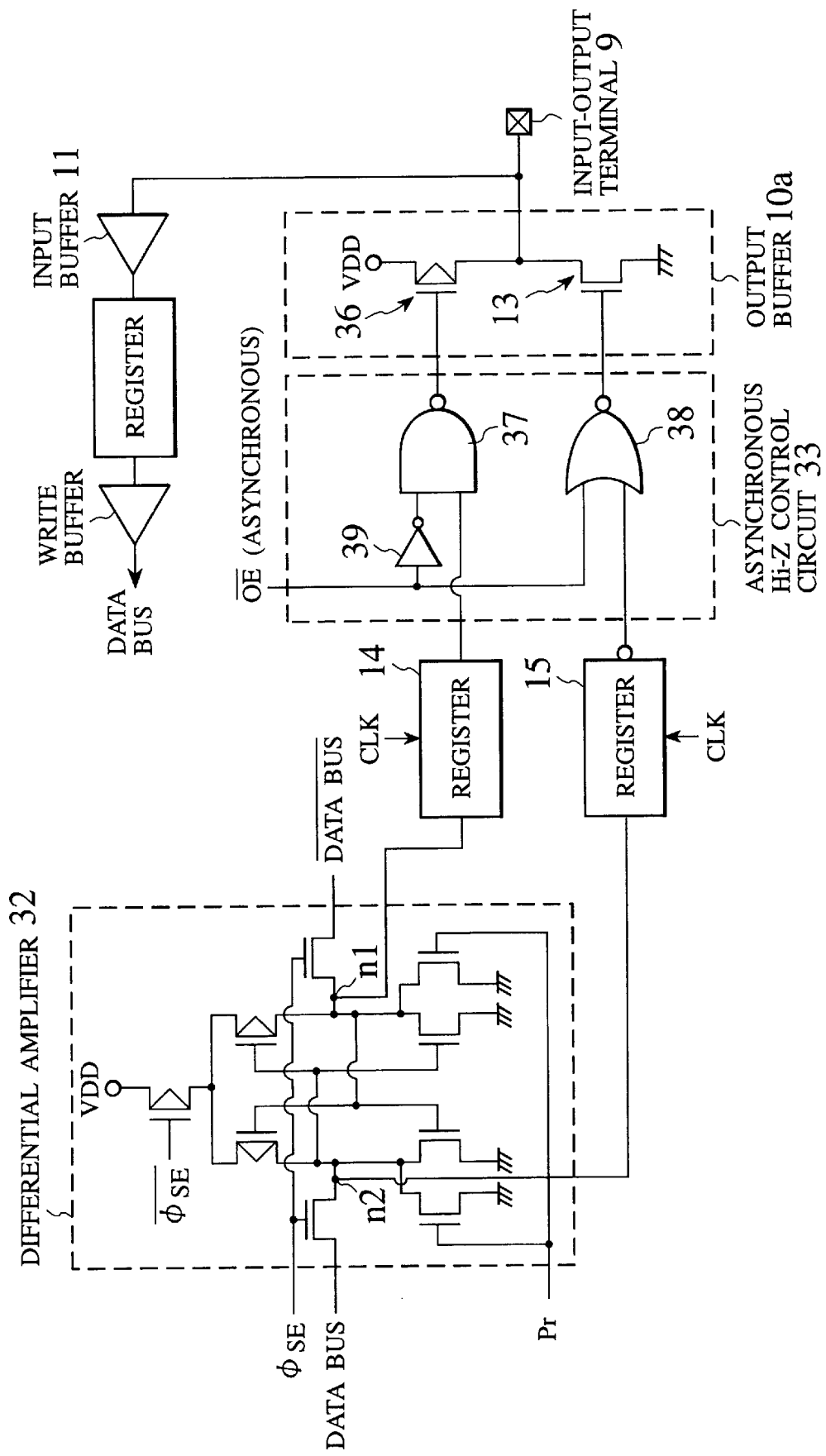

Furthermore, while the output buffer 10 is composed of two n-type MOS transistors in accordance with the first and second embodiments of the present invention, the present invention is not limited to this fashion. For example, the n-type MOS transistor 12 for pulling up the output node of the output buffer 10 may be replaced by the p-type MOS transistor. FIG. 11 is a block diagram showing the data input-output circuit provided with an output buffer 10a which replaces the output buffer 10 as illustrated in FIG. 6 in order that the n-type MOS transistor 12 for pulling up the output node of the output buffer 10 is replaced by the p-type MOS transistor 36. FIG. 12 is a block diagram showing the data input-output circuit with the output buffer 10a replacing the output buffer 10 as illustrated in FIG. 8. Furthermore, FIG. 13 is a block diagram showing the data input-output circuit with the output buffer 10a replacing the output buffer 10 as illustrated in FIG. 9 while FIG. 14 is a block diagram showing the data input-output circuit with the output buffer 10a replacing the output buffer 10 as illustrated in FIG. 10. Meanwhile, the asynchronous Hi-Z control circuit 33 is composed of a 2-input NAND gate 37, a 2-input NOR gate circuit 38 and an inverter circuit 39 in the data input-output circuits as illustrated in FIG. 13 and FIG. 14.

Furthermore, it will be understood from the technical concept of the present invention as described above that the present invention is effective, when applied to an information processing unit provided with a plurality of semiconductor memories (storage devices) 40, 41, 42, . . . are connected to a processor through a single bus 43 as illustrated in FIG. 15, for faster data transfer between the processor and the memories 40, 41, 42, . . . .

It is therefore contemplated that the present invention will cover any such modifications or embodiments not shown herein as fall within the true scope of the present invention. Accordingly, the present invention should be limited only by matters defining an invention in the claims which are appropriate from the view point of the description.

As explained above, in accordance with the present invention, the outputting operation of the output buffer 10 and the Hi-Z control of the output of the output buffer 10 are synchronized with each other. By this configuration, the output of the output buffer 10 can be changed to the Hi-Z state immediately after the data outputting period. Also, in the same manner, the next cycle is possible to output data just after the output buffer starts using the data bus. Accordingly, the present invention is particularly effective for increasing the data communication speed.

Furthermore, in accordance with the present invention, since the operational speed of the data input-output circuit is improved, it is possible to increase data communication in the semiconductor data storage device implemented with the data input-output circuit and the information processing unit implemented with the data input-output circuit.

Various modifications will become possible for those skilled in the art after receiving the teachings of the present disclosure without departing from the scope thereof.

What is claimed is:

1. A data input-output circuit of a semiconductor data storage device comprising:

(a) a temporary data storage circuit for temporarily storing data as input and outputting the data as input, the data as input comprises data of a data bus and control data;

(b) an output buffer connected between the temporary data storage circuit and an output-input terminal of the semiconductor data storage device, the output buffer outputting the data of the data bus to the input-output terminal when the data of the data bus is input from the temporary data storage circuit, and changing an output of the output buffer to a high impedance state, in order to separate the output buffer from the input-output terminal, when the control data is input from the temporary data storage circuit; and (c) An output control circuit for outputting the data of the data bus and the control data to the temporary data storage circuit.

2. The data input-output circuit of the semiconductor data storage device as claimed in claim 1, wherein the output control circuit is connected between the data bus and the temporary data storage circuit and determines whether to output data of the data bus or to output the control data in response to a control signal.

3. The data input-output circuit of the semiconductor data storage device as claimed in claim 2, wherein the temporary data storage circuit includes a first register and a second register for outputting the data as input in synchronism with a clock signal, and the output buffer includes a first n-type MOS transistor and a second n-type MOS transistor connected in series, a source of the first n-type MOS transistor being connected to a first potential source for supplying a predetermined high potential, a gate of the first n-type MOS transistor being connected to an output node of the first register, a source of the second n-type MOS transistor being connected to a second potential source for supplying a predetermined low potential, a gate of the second n-type MOS transistor being connected to an output node of the second register, and drains of the first and second n-type MOS transistors being coupled with each other and connected to the input-output terminal, and the output control circuit includes a first NOR gate circuit and a second NOR gate circuit, one of input nodes of the first NOR gate circuit being connected to a line for supplying the control signal, another of the input nodes of the first NOR gate circuit being connected to the data bus, and an output node of the first NOR gate circuit being connected to an input node of the first register, and one of input nodes of the second NOR gate circuit being connected to the line for supplying the control signal, another of the input nodes of the second NOR gate circuit being connected to the data bus through an inverter circuit, and an output node of the second NOR gate circuit being connected to an input node of the second register.

4. A data input-output circuit of a semiconductor data storage device, comprising:

(a) a temporary data storage circuit for temporarily storing data as input through an amplifier and outputting the data as input, the data as input comprises data of a data bus and a control data; and (b) an output buffer connected between the temporary data storage circuit and an input-output terminal of the semiconductor data storage device, the output buffer outputting the data of the data bus to the input-output terminal when the data of the data bus is input from the temporary data storage circuit, and changing an output of the output buffer to a high impedance state, in order to separate the output buffer from the input-output terminal, when the control data is input from the temporary data storage circuit;

wherein the amplifier outputs the data of the data bus and the control data to the temporary data storage circuit.

5. The data input-output circuit of the semiconductor data storage device as claimed in claim 4, wherein the amplifier is connected between the data bus and the temporary data storage circuit, for outputting the data of the data bus during operation and outputting the control data during non-operation.

6. The data input-output circuit of the semiconductor data storage device as claimed in claim 4, wherein the amplifier includes a differential amplifier connected between the data bus and the temporary data storage circuit, for outputting as the data of the data bus complementary data which consist of data as read out from the data bus and inverted data of the data as read out from the data bus during operation and outputting the control data during non-operation.

7. The data input-output circuit of the semiconductor data storage device as claimed in claim 6, wherein the temporary data storage circuit includes a first register and a second register for outputting the data as input in synchronism with a clock signal, an input node of the first register being connected to a first reference node of the differential amplifier and an input node of the second register being connected to a second reference node of the differential amplifier, and the output buffer includes a first n-type MOS transistor and a second n-type MOS transistor connected in series, a source of the first n-type MOS transistor being connected to a first potential source for supplying a predetermined high potential, a gate of the first n-type MOS transistor being connected to an output node of the first register via an inverted element, a source of the second n-type MOS transistor being connected to a second potential source for supplying a predetermined low potential, a gate of the second n-type MOS transistor being connected to an output node of the second register via an inverted element, drains of the first and second n-type MOS transistors being coupled with each other and connected to the input-output terminal, wherein the differential amplifier outputs the data of the data bus at the first reference node and outputs the inverted data of the data of the data bus at the second reference node during operation, and precharges the first and second reference nodes to the predetermined high potential and outputs the control data at the first and second reference nodes during non-operation.

8. The data input-output circuit of the semiconductor data storage device as claimed in claim 6, wherein the temporary data storage circuit includes a first register and a second register for outputting the data as input in synchronism with a clock signal, an input node of the first register being connected to a first reference node of the differential amplifier and an input node of the second register being connected to a second reference node of the differential amplifier, and the output buffer includes a first n-type MOS transistor and a second n-type MOS transistor connected in series, a source of the first n-type MOS transistor being connected to a first potential source for supplying a predetermined high potential, a gate of the first n-type MOS transistor being connected to an output node of the first register, a source of the second n-type MOS transistor being connected to a second potential source for supplying a predetermined low potential, a gate of the second n-type MOS transistor being connected to an output node of the second register, drains of the first and second n-type MOS transistors being coupled with each other and connected to the input-output terminal, wherein the differential amplifier outputs the data of the data bus at the second reference node and outputs the inverted data of the data of the data bus at the first reference node during operation, and discharges the first and second reference nodes to the predetermined low potential and outputs the control data at the first and second reference nodes during non-operation.

9. The data input-output circuit of the semiconductor data storage device as claimed in claim 7, further comprising an output control circuit between the first and second registers and the first and second n-type MOS transistors, wherein the output control circuit is composed of a first NOR gate circuit and a second NOR gate circuit, one of input nodes of the first NOR gate circuit being connected to a line for supplying a control signal, another of the input nodes of the first NOR gate circuit being connected to the output node of the first register, and the output node of the first NOR gate circuit being connected to the gate of the first n-type MOS transistor, and one of input nodes of the second NOR gate circuit being connected to the line for supplying the control signal, another of the input nodes of the second NOR gate circuit being connected to the output node of the second register, and the output node of the second NOR gate circuit being connected to the gate of the second n-type MOS transistor.

10. The data input-output circuit of the semiconductor data storage device as claimed in claim 8, further comprising an output control circuit between the first and second registers and the first and second n-type MOS transistors, wherein the output control circuit is composed of a first NOR gate circuit and a second NOR gate circuit, one of input nodes of the first NOR gate circuit being connected to a line for supplying a control signal, another of the input nodes of the first NOR gate circuit being connected to the output node of the first register, and the output node of the first NOR gate circuit being connected to the gate of the first n-type MOS transistor, and one of input nodes of the second NOR gate circuit being connected to the line for supplying the control signal, another of the input nodes of the second NOR gate circuit being connected to the output node of the second register, and the output node of the second NOR gate circuit being connected to the gate of the second n-type MOS transistor.

11. The data input-output circuit of the semiconductor data storage device as claimed in claim 6, wherein the temporary data storage circuit includes a first register and a second register for outputting the data as input in synchronism with a clock signal, an input node of the first register being connected to a first reference node of the differential amplifier and an input node of the second register being connected to a second reference node of the differential amplifier, and the output buffer includes a p-type MOS transistor and an n-type MOS transistor connected in series, a source of the p-type MOS transistor being connected to a first potential source for supplying a predetermined high potential, a gate of the p-type MOS transistor being connected to an output node of the first register, a source of the n-type MOS transistor being connected to a second potential source for supplying a predetermined low potential, a gate of the n-type MOS transistor being connected to an output node of the second register via an inverted element, drains of the p-type and n-type MOS transistors being coupled with each other and connected to the input-output terminal, wherein the differential amplifier outputs the data of the data bus at the first reference node and outputs the inverted data of the data of the data bus at the second reference node during operation, and precharges the first and second reference nodes to the predetermined high potential and outputs the control data at the first and second reference nodes during non-operation.

12. The data input-output circuit of the semiconductor data storage device as claimed in claim 6, wherein the temporary data storage circuit includes a first register and a second register for outputting the data as input in synchronism with a clock signal, an input node of the first register being connected to a first reference node of the differential amplifier and an input node of the second register being connected to a second reference node of the differential amplifier, and the output buffer includes a p-type MOS transistor and an n-type MOS transistor connected in series, a source of the p-type MOS transistor being connected to a first potential source for supplying a predetermined high potential, a gate of the p-type MOS transistor being connected to an output node of the first register via an inverted element, a source of the n-type MOS transistor being connected to a second potential source for supplying a predetermined low potential, a gate of the n-type MOS transistor being connected to an output node of the second register, drains of the n-type and p-type MOS transistors being coupled with each other and connected to the input-output terminal, wherein the differential amplifier outputs the data of the data bus at the first reference node and outputs the inverted data of the data of the data bus at the second reference node during operation, and discharges the first and second reference nodes to the predetermined low potential and outputs the control data at the first and second reference nodes during non-operation.

13. The data input-output circuit of the semiconductor data storage device as claimed in claim 11, further comprising an output control circuit between the first and second registers and the p-type and n-type MOS transistors, wherein the output control circuit is composed of a NAND gate circuit and a NOR gate circuit, one of input nodes of the NAND gate circuit being connected to a line for supplying a control signal via an inverter circuit, another of the input nodes of the NAND gate circuit being connected to the output node of the first register via an inverted element, and an output node of the NAND gate circuit being connected to the gate of the p-type MOS transistor, and one of input nodes of the NOR gate circuit being connected to the line for supplying the control signal, another of the input nodes of the NOR gate circuit being connected to the output node of the second register, and an output node of the NOR gate circuit being connected to the gate of the n-type MOS transistor.

14. The data input-output circuit of the semiconductor data storage device as claimed in claim 12, further comprising an output control circuit between the first and second registers and the p-type and n-type MOS transistors, wherein the output control circuit is composed of a NAND gate circuit and a NOR gate circuit, one of input nodes of the NAND gate circuit being connected to a line for supplying a control signal via an inverter circuit, another of the input nodes of the NAND gate circuit being connected to the output node of the first register, and an output node of the NAND gate circuit being connected to the gate of the p-type MOS transistor, and one of input nodes of the NOR gate circuit being connected to the line for supplying the control signal, another of the input nodes of the NOR gate circuit being connected to the output node of the second register via an inverted element, and an output node of the NOR gate circuit being connected to the gate of the n-type MOS transistor.

15. A semiconductor data storage device comprising a memory cell array in which a number of memory cells are regularly arranged in the form of a matrix, a row decoder and a column decoder for selecting the respective memory cells of a plurality of the memory cells in the memory cell array, and a data input-output circuit for inputting and outputting data of the memory cells selected by the row decoder and the column decoder, the data input-output circuit comprising:

(a) a temporary data storage circuit for temporarily storing data as input and outputting the data as input, the data as input comprises data of a data bus and a control data;

(b) an output buffer connected between the temporary data storage circuit and the input-output terminal of the semiconductor data storage device, the output buffer outputting the data of the data bus to the input-output terminal when the data of the data bus is input from the temporary data storage circuit, and changing an output of the output buffer to a high impedance state, in order to separate the output buffer from the input-output terminal, when the control data is input from the temporary data storage circuit; and (c) an output control circuit for outputting the data of the data bus and the control data to the temporary data storage circuit.

16. A semiconductor data storage device comprising a memory cell array in which a number of the memory cells are regularly arranged in the form of a matrix, a row decoder and a column decoder for selecting the respective memory cells of a plurality of the memory cells in the memory cell array, and a data input-output circuit for inputting and outputting data of the memory cells selected by the row decoder and the column decoder, the data input-output circuit comprising;

(a) a temporary data storage circuit for temporarily storing data as input through an amplifier and outputting the data as input, the data as input comprises data of a data bus and a control data; and (b) an output buffer connected between the temporary data storage circuit and the input-output terminal of the semiconductor data storage device, the output buffer outputting the data of the data bus to the input-output terminal when the data of the data bus in input from the temporary data storage circuit, and changing an output of the output buffer to a high impedance state, in order to separate the output buffer from the input-output terminal, when the control data is input from the temporary data storage circuit;

wherein the amplifier outputs the data of the data bus and the control data to the temporary data storage circuit.

17. The semiconductor data storage device as claimed in claim 15, wherein the semiconductor data storage device is a storage device as part of an information processing unit.

18. The semiconductor data storage device as claimed in claim 17, wherein the information processing unit comprises:

(a) a plurality of storage devices;

(b) a processor for conducting various processes in communication and cooperation with the storage devices;

(c) an input-output device for exchanging data with an external device; and (d) a bus provided for communication among the storage devices, the processor and the input-output device.

19. The semiconductor data storage device as claimed in claim 16, wherein the semiconductor data storage device is a storage device as part of an information processing unit.

20. The semiconductor data storage device as claimed in claim 19, wherein the information processing unit comprises:

(a) a plurality of storage devices;

(b) a processor for conducting various processes in communication with the storage devices;

(c) an input-output device for exchanging data with an external device; and (d) a bus to which are connected the storage devices, the processor and the input-output device provided for communication thereamong.

* * * * *